United States Patent
Hulbert et al.

(10) Patent No.: US 8,400,179 B1
(45) Date of Patent: Mar. 19, 2013

(54) METHOD FOR LOAD-LINE CORRECTION OF PULSED MEASUREMENTS

(75) Inventors: Pete Hulbert, Cleveland, OH (US); Gregory Sobolewski, Seven Hills, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 246 days.

(21) Appl. No.: 12/506,007

(22) Filed: Jul. 20, 2009

(51) Int. Cl.
*G01R 31/26* (2006.01)
*G01R 31/3187* (2006.01)

(52) U.S. Cl. ............................. 324/762.01; 324/750.3

(58) Field of Classification Search .......... 324/761.01–761.02, 762.01–762.09, 324/754.01–754.09; 438/14–18; 257/48
See application file for complete search history.

(56) References Cited

U.S. PATENT DOCUMENTS

| | | | |
|---|---|---|---|
| 7,078,927 B2 * | 7/2006 | Tanida et al. | 324/762.01 |
| 7,242,200 B2 * | 7/2007 | Okawa | 324/713 |
| 7,280,929 B1 | 10/2007 | Zhao | |
| 7,486,095 B2 * | 2/2009 | Long | 324/762.02 |
| 7,518,378 B2 | 4/2009 | Mehta et al. | |

\* cited by examiner

*Primary Examiner* — Tung X Nguyen
(74) *Attorney, Agent, or Firm* — Pearne & Gordon LLP

(57) ABSTRACT

A method for operating a measurement system having an interconnect between the measurement system and a device under test (DUT), the interconnect exhibiting voltage drops during measurements of the DUT, includes applying a test signal to the DUT through the interconnect, the test signal having a system value at the measurement system; measuring a resulting DUT value at the DUT; adjusting the system value according to the resulting DUT value to produce successive desired DUT values at the DUT; and using the successive DUT values to measure an electrical characteristic of the DUT.

6 Claims, 1 Drawing Sheet

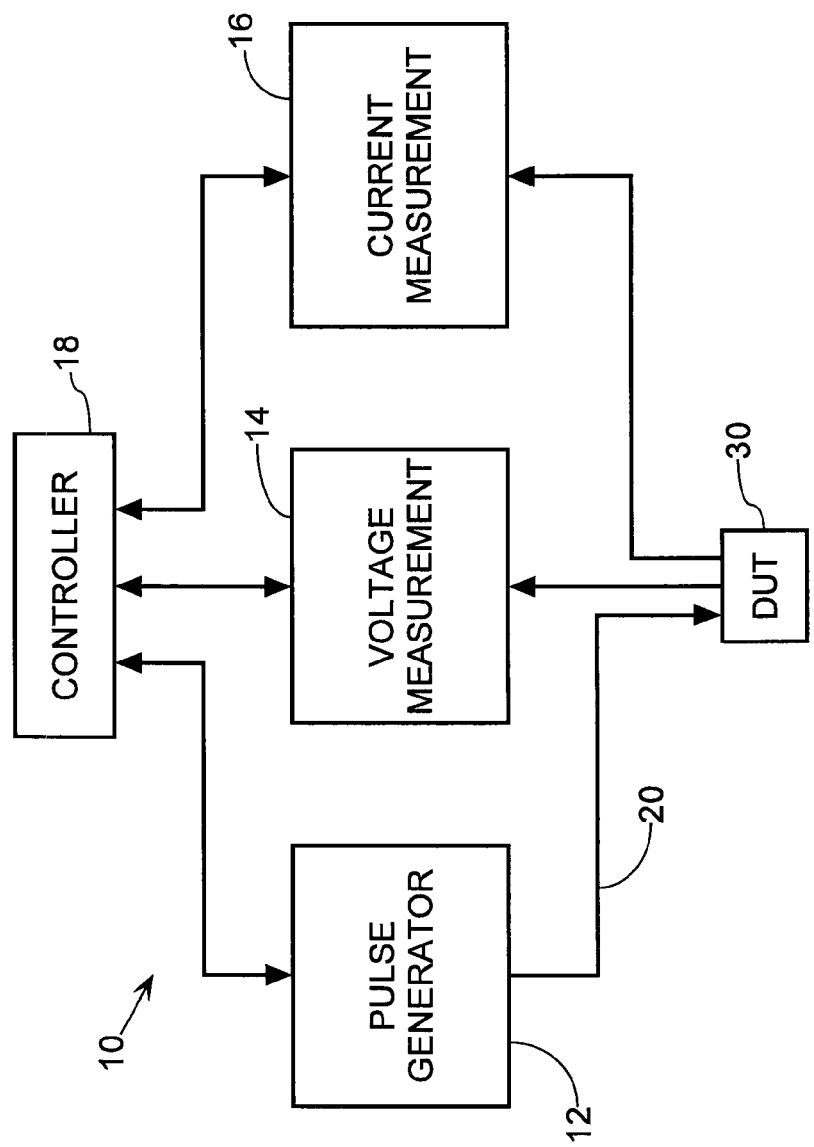

METHOD FOR LOAD-LINE CORRECTION OF PULSED MEASUREMENTS

BACKGROUND OF THE INVENTION

The present invention relates to electrical measurements and, in particular, to pulsed measurements.

Advances in semiconductor technology have lead to an increasing need to perform pulsed measurements. Typically in a test, there is a voltage drop in the interconnect between the test instrument and the device under test (DUT). With DC testing, it is common to use a Kelvin connection to the DUT. This allows the voltage (or current) at the DUT to be directly set, essentially ignoring the voltage drop in the interconnect. This is not suitable for a pulsed measurement.

A typical semiconductor device has a nonlinear response to applied signals. The current through the device determines the voltage drop across the interconnect. If, for example, the voltage pulse applied across the interconnect and DUT is incremented in even steps, the voltage across the DUT will typically not be in even steps.

However, when characterizing a DUT, it is desirable to have equally spaced values at the DUT. Typically, the voltage pulse across the interconnect and the DUT is stepped through values and the response is measured. The response is then analyzed to interpolate equally spaced input values which are used in modeling the devices. This is called "gridding" the response. This approach tends to require excessive pulses and substantial post processing of the data.

SUMMARY OF THE INVENTION

A method for operating a measurement system having an interconnect between the measurement system and a device under test (DUT), the interconnect exhibiting voltage drops during measurements of the DUT, includes applying a test signal to the DUT through the interconnect, the test signal having a system value at the measurement system; measuring a resulting DUT value at the DUT; adjusting the system value according to the resulting DUT value to produce successive desired DUT values at the DUT; and using the successive DUT values to measure an electrical characteristic of the DUT.

BRIEF DESCRIPTION OF THE DRAWINGS

The FIGURE is a block diagram of an example of a measurement system suitable for practicing the invention.

DESCRIPTION OF THE PREFERRED EMBODIMENTS

Referring to the FIGURE, a measurement system 10 includes a pulse generator 12, a voltage measurement instrument 14, a current measurement instrument 16, a controller 18 and an interconnect 20 that can be connected between the pulse generator 12 and a device under test (DUT) 30.

The pulse generator 12, and the instruments 14, 16 are controlled by the controller 18. The pulse generator 12 is controlled to apply a measurement system voltage through the interconnect 20 to the DUT 30. The voltage measurement instrument 14 is controlled to measure the DUT voltage across the DUT 20. The current measurement instrument 16 is controlled to measure the current through the DUT 30. The controller 18 records, processes and controls the measurements.

The measurement system 10 provides measurements of the electrical characteristics of the DUT 30. For example, pulse IV or transient IV curves.

In some cases the voltage measurement instrument 12 and/or the current measurement instrument 14 may include the ability to measure multiple voltages/currents present in the DUT 30.

Also, it should be noted that in some cases the pulse generator 12 may produce not only simple pulses but multi-level waveforms or other more complex waveforms. In addition, rapidly performed DC measurements may begin to correspond more closely to pulses than to classic DC measurements.

In operation, a test signal from the pulse generator 12 is applied to the DUT 30 through the interconnect 20 (typically cabling and a test head). The test signal has a system value (e.g., a pulse voltage amplitude) at the measurement system. This results in a DUT value at the DUT 30 (e.g., a voltage that summed with the voltage drop in the interconnect 20 equals the system value) which is measured, for example, by the voltage measurement instrument 14.

One or more of the DUT values can be used to estimate the next system value needed to produce the next desired DUT value and so on, adjusting the system value according to the resulting DUT value to produce successive desired DUT values at the DUT 30. It may be adequate to use the difference between the system value and the DUT value to predict the correction for the next desired DUT value, but more sophisticated techniques such as curve-fitting may be used for better accuracy.

The successive DUT values plus the resulting successive signals in the DUT 30 (e.g., a current measured by the current measurement instrument 18) are used to provide a measurement of an electrical characteristic of the DUT (e.g., pulse IV).

Because the measurement method allows the DUT values to be directly selected, it is possible to choose equally spaced values. This results in a measured characteristic that is already "gridded" for use in DUT modeling.

It should also be noted that because the DUT voltage can be directly controlled, it is just as easy to control DUT current as measured by the current measurement instrument 16. This allows current also to be swept as desired, including producing values that are equally spaced. Either the DUT voltage or the DUT current may be set to a desired DUT value.

A further extension of the method includes using one or both of the instruments 14, 16 to measure multiple points on the DUT 30 contemporaneously and using a selection of the measurements to control the measurement system 10.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for operating a measurement system having an interconnect between the measurement system and a device under test (DUT), said interconnect exhibiting voltage drops during measurements of said DUT, said method comprising:
   applying a test signal in the form of a pulse waveform to said DUT through said interconnect, said test signal having a system value at said measurement system;
   measuring a resulting DUT value at said DUT;

adjusting said system value according to the resulting DUT value to produce successive desired DUT values at said DUT; and using said successive DUT values to measure an electrical characteristic of said DUT.

2. A method according to claim 1, wherein said successive desired DUT values provide equally spaced values.

3. A method according to claim 1, wherein said DUT value is a voltage.

4. A method according to claim 1, wherein said DUT value is a current.

5. A method according to claim 1, wherein more than one successive DUT value is used for each said adjusting.

6. A method according to claim 1, further comprising measuring a plurality of contemporaneous resulting DUT values at said DUT; and adjusting said system value according to the plurality of contemporaneous DUT values to produce said successive desired DUT value at said DUT.

* * * * *